United States Patent [19]
Tsuda et al.

[11] Patent Number: 5,422,336
[45] Date of Patent: Jun. 6, 1995

[54] SUPERCONDUCTING FET WITH PR-BA-CU-O CHANNEL

[75] Inventors: Koichi Tsuda, Yokosuka; Toshiyuki Matsui, Tokyo; Takeshi Suzuki, Zushi; Hiroshi Kimura, Tokyo; Takashi Ishii, Yokosuka; Akihiko Ohi, Yokosuka; Kazuo Mukae, Yokosuka, all of Japan

[73] Assignee: Fuji Electric Co., Ltd., Japan

[21] Appl. No.: 124,788

[22] Filed: Sep. 22, 1993

[30] Foreign Application Priority Data

Sep. 30, 1992 [JP] Japan .................. 4-261668

[51] Int. Cl.⁶ .................. H01L 39/22; H01B 12/00; B05D 5/12
[52] U.S. Cl. .................. 505/193; 257/34; 257/36; 257/39; 505/237; 505/779; 427/62; 427/63
[58] Field of Search .................. 257/36–39; 505/110, 191, 193, 329, 700–703, 779, 237; 427/62, 63

[56] References Cited

U.S. PATENT DOCUMENTS

| | | | |
|---|---|---|---|
| 5,064,808 | 11/1991 | Merzhanov et al. | 505/481 |
| 5,143,895 | 9/1992 | Uchida et al. | 505/779 |
| 5,250,506 | 10/1993 | Saitoh et al. | 505/191 |

FOREIGN PATENT DOCUMENTS

| | | | |
|---|---|---|---|
| 0324044 | 7/1989 | European Pat. Off. | 257/39 |
| 3-191581 | 8/1991 | Japan . | |

OTHER PUBLICATIONS

Superconductive Electronics, J. IEEE Japan, vol. 108, No. 10, 1988 by Hisao Hayakawa.

*Primary Examiner*—Mahshid D. Saadat
*Attorney, Agent, or Firm*—Parkhurst, Wendel & Rossi

[57] ABSTRACT

A superconducting transistor with superior withstand voltage having source region and a drain region formed of oxide superconductors 3, a $PrBa_2Cu_3O_{7-x}$ layer 2 or an $ScBa_2Cu_3O_{7-x}$ layer 2 forming an intermediate region sandwiched by the source and drain regions. The regions are disposed on a substrate 1. An insulation layer 4 is disposed on the intermediate region. A transistor uses the intermediate region as an insulator when the gate is turned off, and as a superconductor when the gate is turned on.

4 Claims, 2 Drawing Sheets

5,422,336

SUPERCONDUCTING FET WITH PR-BA-CU-O CHANNEL

FIELD OF THE INVENTION

The present invention relates to a superconducting device, and more particularly to a field-effect transistor that uses a high-temperature oxide superconductor.

BACKGROUND OF THE INVENTION

Because the superconduction phenomenon reduces electric resistance to zero, it has become necessary to develop high-speed and low-power consuming superconducting transistors utilizing this phenomenon, and several types of structures have been proposed. Among these is a voltage-driven superconducting transistor that can be driven easily because of its large input impedance, and low input loss. The development of such a device is particularly desirable.

FIG. 3 is a cross section of a conventional voltage-driven superconducting transistor. The superconducting transistor has a structure in which a source 11 and a drain 12, which are superconducting electrodes, are disposed via an arsenic ion-driven part 15 on an Si single crystal substrate 14. Moreover, a gate 13, which is insulated by a gate oxide film between the source and the drain, is also disposed, the gate being covered by a side insulation film 17 and an overhang 16. In this case, for example, the source and drain are made of Nb, the gate 13 is made of polycrystalline Si, the overhang 16 and side insulation film 17 are made of $Si_3N_4$, and the gate oxide film 18 is made of $SiO_2$.

A region under the gate oxide film 18 is called a channel 19.

In the conventional superconducting transistor described above, the Cooper pairs, whose length is about the same as the coherence length, penetrate through the channel from the source and the drain, so that the coherence length is modulated by changing the strength of the impressed voltage on the gate so that the source and drain can be linked using these Cooper pairs.

Since this coherence length has conventionally been about several tens of nm, conventional superconducting transistors have required that the gate and drain be drawn closer together so that they are spaced apart only about 0.1 microns.

FIG. 4 is a line diagram showing the current-voltage characteristics of a conventional superconducting transistor. The horizontal axis represents the source-drain voltage while the vertical axis represents the source-drain current, and the diagram shows the current-voltage characteristics when the gate voltage varies from 0.5V to 1V and 2V.

Besides the voltage-driven superconducting transistor described above, current-driven superconducting transistors have also been proposed, although there have been no reports of such transistors with good characteristics, since application of current results in heat generation and only a small current gain.

As described above, conventional voltage-driven superconducting transistors require that the gate length (distance between the source and the drain) be 0.1 microns or less because the coherence length is short. Furthermore, in superconducting transistors that use oxides to make the superconductor, the gate length must be even shorter because the coherence length λ in an oxide superconductor with a critical temperature Tc of 40 K or higher is less than several nm. Manufacturing a device with such a short gate length is extremely difficult. In addition, the distance between the source and the drain becomes so small that the withstand voltage between this source and the drain when an element is in an off state also becomes very small, making it very difficult to bond it with a conventional semiconductor element.

SUMMARY OF THE INVENTION

The present invention has considered the above-described problems, and represents an attempt to create a superconducting transistor with superior withstand voltage by increasing the distance between the source and the drain by placing a new insulator between the source and the drain.

According to the first embodiment, the above objective can be achieved by making a superconducting element with a source region, an intermediate region, a drain region, an insulating layer, a source electrode, a drain electrode, and a gate electrode on a substrate, wherein the source region, the drain region and the intermediate region are disposed directly on top of the substrate, the source region and the drain region are p-type oxide superconductors, the intermediate region is arranged between the source region and the drain region, the insulation layer is disposed on said intermediate region, the drain electrode is connected to the drain region, the gate electrode is connected to the insulation layer, and the intermediate region consists of an oxide $PrBa_2Cu_3O_{7-x}$.

According to the second embodiment, the above objective can be achieved by creating a superconducting device with a source region, an intermediate region, a drain region, an insulating layer, a source electrode, a drain electrode, and a gate electrode on a substrate, wherein the source region, the drain region and the intermediate region are disposed directly on top of the substrate, the source region and the drain region are p-type oxide superconductors, the intermediate region is arranged between the source region and the drain region, the insulation layer is disposed on said intermediate region, the drain electrode is connected to the drain region, the gate electrode is connected to the insulation layer, and the intermediate region consists of an oxide $ScBa_2Cu_3O_{7-x}$.

DETAILED DESCRIPTION OF THE PREFERRED EMBODIMENTS

Figure 1:
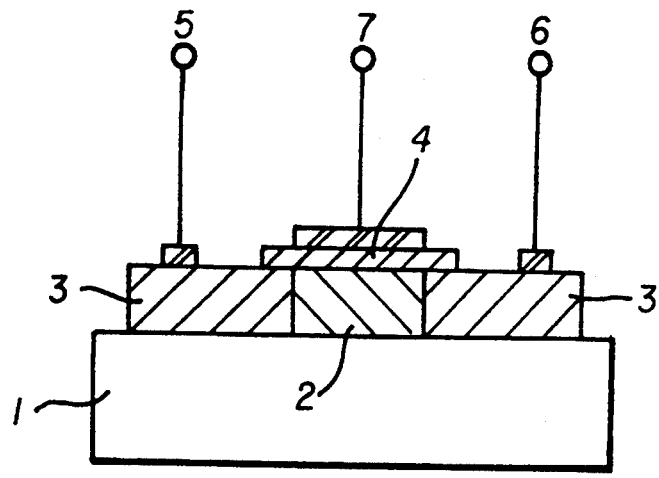
FIG. 1 is a cross section showing a superconducting transistor according to one embodiment of the present invention.

FIG. 1 shows a cross section of a superconducting transistor according to one embodiment of the present invention. $SrTiO_3$ is used as the substrate 1, on which a $PrBa_2Cu_3O_{7-x}$ layer 2 is formed, and moreover, $YBa_2Cu_3O_{7-x}$ layers, which are p-type oxide superconductors, are put at the both ends of the layer 2. A $SrTiO_3$ layer is formed on the $PrBa_2Cu_3O_{7-x}$ layer as an insulation layer 4, and a gate electrode 7 is formed thereon. A source electrode 5 and a drain electrode 6 are formed on the $YBa_2Cu_3O_{7-x}$ layer.

Figure 2:
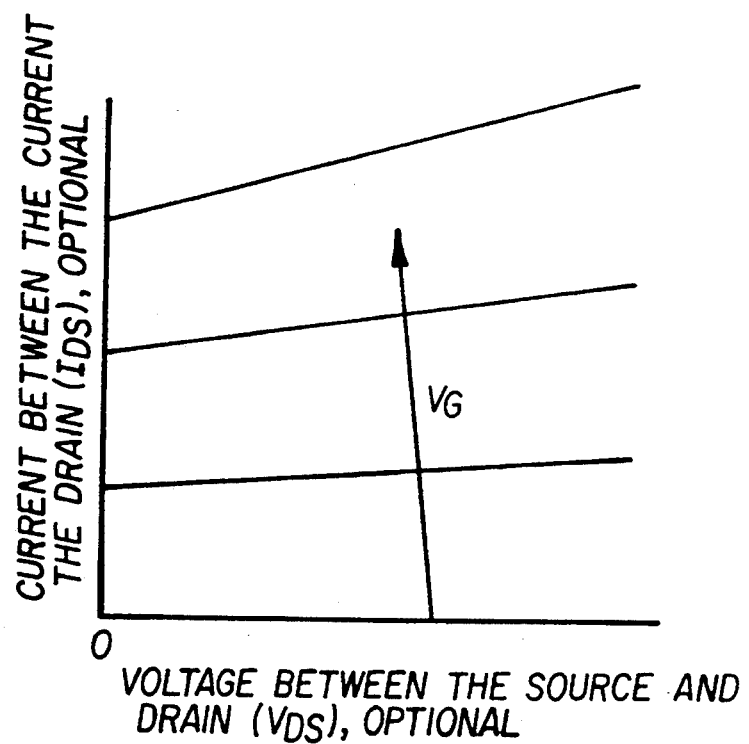
FIG. 2 is a line diagram showing the relationship between the voltage between a source and a drain ($V_{DS}$) and the current between the source and the drain ($I_{DS}$) in a superconducting transistor according to one embodiment of the present invention.
Figure 3:
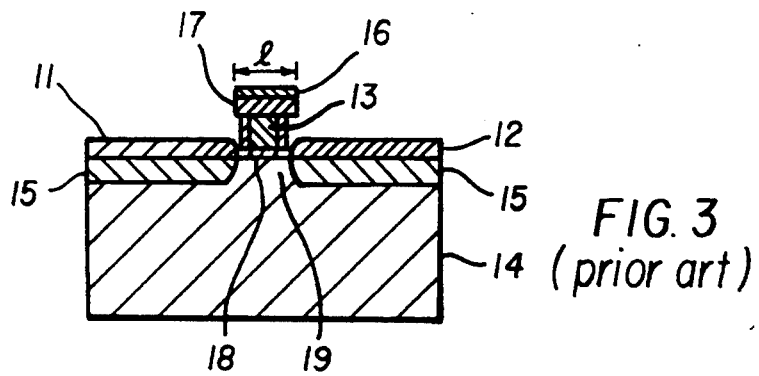
FIG. 3 is a cross section of a conventional superconducting transistor.
Figure 4:
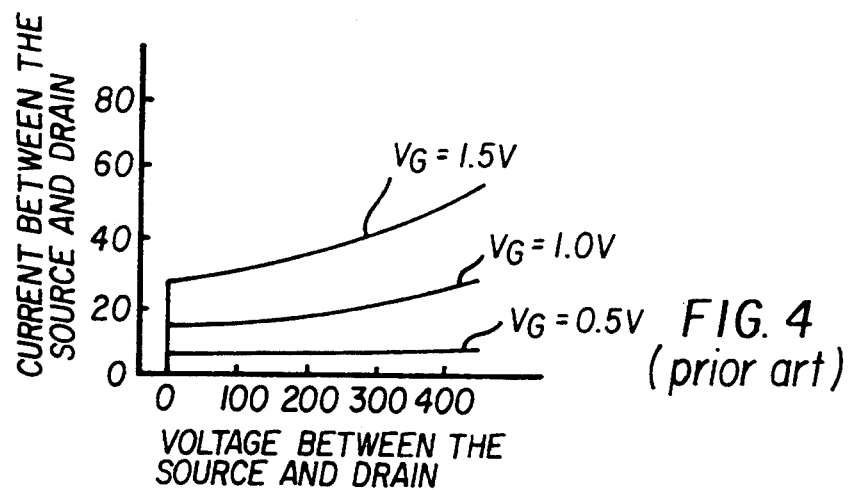
FIG. 4 is a line diagram showing the current/voltage characteristics of a conventional superconducting transistor.

FIG. 2 is a line diagram showing the relationship between the voltage between a source and a drain ($V_{DS}$) and the current between the source and the drain ($I_{DS}$) in a superconducting transistor according to one embodiment of the present invention. Changes based on the gate voltage ($V_G$) are also shown. Because $ScBa_2Cu_3O_{7-x}$ has characteristics that are similar to those of $PrBa_2Cu_3O_{7-x}$, a device was fabricated using $ScBa_2Cu_3O_{7-x}$ in place of $PrBa_2Cu_3O_{7-x}$ to investigate its electrical characteristics. As a result, the same characteristics that were described earlier could be observed.

Oxide high-temperature superconductors with a $CuO_2$ face, and a perovskite structure or similar crystal structure include a wide variety of systems such as the La-Ba-Cu-O group, the La-Sr-Cu-O group, the Ln-Ba-Cu-O (Ln=Y, La, Nd, Sm, Eu, Gd, Tb, Dy, Ho, Er, Tm, Yb and Lu) group, the Bi-Sr-Ca-Cu-O group, the Tl-Ba-Cu-O group, the Sr-Ca-Cu-O group and the Nd-Ce-Cu-O group. Unlike conventional superconductors, these oxide high-temperature superconductors not only have a high Tc, but also the following features:

(1) p-type superconduction and n-type superconduction;
(2) by using the carrier concentration, the transition from superconducting phase to the metal, semiconducting, and insulating phases is caused;
(3) low carrier concentration;
(4) a superconduction phase adjoining an anti-ferromagnetic insulation phase;

Of the above superconductors, it is known that the Nd-Ce-Cu-O group ($Nd_{2-x}Ce_xCuO_4$) is an n-type superconductor while the others are p-type superconductors. The p-type superconductors have a number of common points other than the difference in Tc, and their representative material is the La-Sr-Cu-O group ($La_{2-x}Sr_xCuO_4$).

$Nd_{2-x}Ce_xCuO_4$ is an anti-ferromagnetic insulator at $x=0$ namely $Nd_2CuO_4$. Doping this material with Ce, which is a quadrivalent metal, increases free electron concentration leading to metallic conduction at about $x=0.15$. If the temperature is decreased at this time, the electrons form Cooper pairs, which allow for superconduction (n-type superconductor).

On the other hand, $La_{2-x}Sr_xCuO_4$ is an anti-ferromagnetic insulator at $x=0$, namely $La_2CuO_4$. Doping this material with Sr, which is a bivalent metal, increases the free-hole concentration leading to metallic conduction at about $\times=0.05$. If the temperature is decreased at this time, the holes form Cooper pairs, which allow for superconduction (p-type superconductor).

Figure 5:
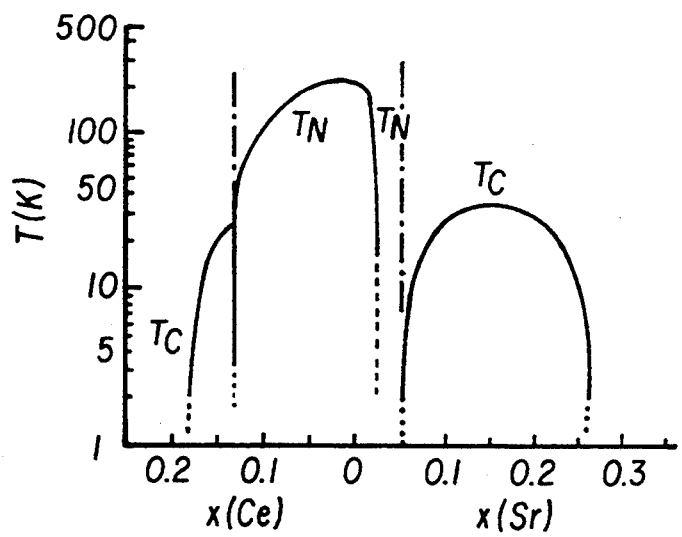
FIG. 5 is a line diagram showing the relationship between the Ce or Sr doping amount in $Nd_{2-x}Ce_xCuO_4$, $La_{2-x}Sr_xCuO_4$ and the superconducting critical temperature ($T_C$) or the anti-ferromagnetic critical temperature ($T_N$).

FIG. 5 is a line diagram showing the relation between a doping amount of Ce or Sr in $Nd_{2-x}Ce_xCuO_4$, $La_{2-x}Sr_xCuO_4$ and the superconduction critical temperature Tc or the anti-ferromagnetic critical temperature $T_N$ (Neel temperature).

On the other hand, $PrBa_2Cu_3O_{7-x}$ is known as a substance that does not become a superconductor because of its insufficient carrier concentration notwithstanding a crystal structure that is similar to that of above oxide superconductors.

The present invention takes into account the above characteristics of high-temperature superconductors that allow for superconduction transfer if the carrier concentration can be raised in $PrBa_2Cu_3O_{7-x}$ by some means. One method of injecting a carrier into $PrBa_2Cu_3O_{7-x}$ calls for applying voltage onto an interface to bend an energy band and store a carrier on its surface. The carrier in this case is positive hole. This positive hole needs to be injected from a source or a drain; however, when the source or drain is made of metal, a hetero-junction is produced on the interface of the source or drain with $PrBa_2Cu_3O_{f-x}$. As a result, a barrier is formed, inhibiting the smooth injection of the carrier. Therefore, a superconductor is used to form the source or drain regions. Thus, a band construction allows for a smooth bonding between the source and $PrBa_2Cu_3O_{7-x}$ and the drain, thereby permitting carrier injection.

When positive holes are injected from the above source region or the drain region onto the surface of $PrBa_2Cu_3O_{7-x}$ provided between the source region and the drain region, the injected positive holes create Coopers pairs at low temperatures. As a result, a superconduction current flows through the source region and the drain region, thereby forming a voltage-driven superconducting transistor.

Of course, when the gate voltage at the superconducting transistor is in an off state, the $PrBa_2Cu_3O_{7-x}$ region provided between the above source and drain regions serves as an insulator that offers perfect insulation. In addition, because there is no restriction on the size of the intermediate region between the source region and the drain region, and because the distance between the source and the drain can be increased, a superconducting transistor with large withstand voltage can be obtained.

The above embodiments should not be limited to the use of the $YBa_2Cu_3O_{7-x}$ group as the oxide superconductor, but should also be applied to the La-Ba-Cu-O group, the La-Sr-Cu-O group, the Ln-Ba-Cu-O (Ln=La, Nd, Sm, Eu, Gd, Tb, Dy, Ho, Er, Tm, Yb and Lu) group, the Bi-Sr-Ca-Cu-O group, the Tl-Ba-Cu-O group, and the Sr-Ca-Cu-O group.

According to the present invention, the intermediate region between the source and the drain exhibits an insulation property when the gate voltage is turned off, and becomes a superconductor when a carrier is injected onto the surface of the intermediate region while the gate voltage is turned on. Because with such superconducting transistors there are no size restrictions with respect to an intermediate region between the source and the drain, and distance between the source and the drain can be increased, a superconducting transistor with large withstand voltage can be obtained.

What is claimed is:

1. A superconducting device comprising:
 a source region, a drain region and an intermediate region disposed on a substrate, the intermediate region being arranged between the source region and the drain region such that the intermediate region is in direct contact with each of the source and drain regions;
 an insulation layer disposed on said intermediate region;

a source electrode connected to said source region;

a drain electrode connected to the drain region; and a gate electrode connected to the insulation layer, wherein the intermediate region comprises $PrBa_2Cu_3O_{7-x}$ and the source and drain regions are p-type oxide superconductors.

2. The superconducting device of claim 1, wherein the p-type oxide superconductor is an oxide of one of the following groups: La-Ba-Cu-O, La-Sr-Cu-O, Ln-Ba-Cu-O (wherein Ln is at least one of Y, La, Nd, Sm, Eu, Gd, Tb, Dy, Ho, Er, Tm, Yb and Lu), Bi-Sr-Ca-Cu-O, Tl-Ba-Cu-O and Sr-Ca-Cu-O.

3. A superconducting device comprising:

a source region, a drain region and an intermediate region disposed on a substrate, the intermediate region being arranged between the source region and the drain region such that the intermediate region is in direct contact with each of the source and drain regions;

an insulation layer disposed on said intermediate region;

a source electrode connected to said source region;

a drain electrode connected to the drain region; and a gate electrode connected to the insulation layer; wherein the intermediate region comprises $ScBa_2Cu_3O_{7-x}$, and the source and the drain regions are p-type oxide superconductors.

4. The superconducting device of claim 3, wherein the p-type oxide superconductor is an oxide of one of the following groups: La-Ba-Cu-O, La-Sr-Cu-O, Ln-Ba-Cu-O, (wherein Ln is at least one of Y, La, Nd, Sm, Eu, Gd, Tb, Dy, Ho, Er, Tm, Yb and Lu), Bi-Sr-Ca-Cu-O, Tl-Ba-Cu-O and Sr-Ca-Cu-O.

* * * * *